United States Patent
Li et al.

(10) Patent No.: US 9,614,034 B1
(45) Date of Patent: Apr. 4, 2017

(54) SEMICONDUCTOR STRUCTURE AND METHOD FOR FABRICATING THE SAME

(71) Applicant: UNITED MICROELECTRONICS CORP., Hsin-Chu (TW)

(72) Inventors: Jhen-Cyuan Li, New Taipei (TW); Nan-Yuan Huang, Tainan (TW); Shui-Yen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/884,787

(22) Filed: Oct. 16, 2015

(30) Foreign Application Priority Data

Sep. 17, 2015  (CN) .......................... 2015 1 0593437

(51) Int. Cl.
| | | |
|---|---|---|
| *H01L 29/78* | (2006.01) | |
| *H01L 29/06* | (2006.01) | |
| *H01L 29/66* | (2006.01) | |
| *H01L 21/762* | (2006.01) | |

(52) U.S. Cl.
CPC .... *H01L 29/0653* (2013.01); *H01L 21/76232* (2013.01); *H01L 29/66795* (2013.01); *H01L 29/7851* (2013.01)

(58) Field of Classification Search
CPC .................................................. H01L 27/0886
See application file for complete search history.

(56) References Cited

U.S. PATENT DOCUMENTS

| | | | | | |
|---|---|---|---|---|---|
| 5,965,914 | A * | 10/1999 | Miyamoto | ........ | H01L 29/42392 257/331 |
| 7,002,207 | B2 * | 2/2006 | Kim | .................. | H01L 21/82341 257/331 |
| 7,719,038 | B2 * | 5/2010 | Kim | .................. | H01L 21/82341 257/241 |
| 7,863,122 | B2 | 1/2011 | Booth, Jr. | | |
| 8,361,869 | B2 | 1/2013 | Zhou | | |
| 9,153,496 | B2 * | 10/2015 | Wong | ................. | H01L 21/82341 |
| 2005/0285204 | A1* | 12/2005 | Kim | ........................ | H01L 21/84 257/368 |
| 2011/0227145 | A1* | 9/2011 | Renn | ................. | H01L 27/10823 257/328 |
| 2014/0065782 | A1* | 3/2014 | Lu | ......................... | H01L 29/785 438/294 |
| 2014/0213031 | A1* | 7/2014 | Lin | .................... | H01L 29/66545 438/296 |
| 2014/0252489 | A1* | 9/2014 | Yu | ..................... | H01L 29/66795 257/368 |
| 2015/0249155 | A1* | 9/2015 | Xu | ..................... | H01L 21/02164 257/347 |
| 2015/0333061 | A1* | 11/2015 | Kim | .................... | H01L 27/0886 257/401 |

\* cited by examiner

*Primary Examiner* — Eugene Lee
(74) *Attorney, Agent, or Firm* — Winston Hsu; Scott Margo

(57) ABSTRACT

The present invention provides a semiconductor structure, including a substrate, having a recess disposed therein, an insulating layer filled in the recess and disposed on a surface of the substrate, and at least one fin structure disposed in the insulating layer, the fin structure consisting of two terminal parts and a central part disposed between two terminal parts. The terminal parts are disposed on the surface of the substrate and directly contact the substrate, and the central part is disposed right above the recess.

20 Claims, 5 Drawing Sheets

SEMICONDUCTOR STRUCTURE AND METHOD FOR FABRICATING THE SAME

BACKGROUND OF THE INVENTION

1. Field of the Invention

The invention relates to a semiconductor structure and fabrication method thereof, and more particularly, to a semiconductor structure having a partially suspended fin structure.

2. Description of the Prior Art

With the trend in the industry being towards scaling down the size of the metal oxide semiconductor transistors (MOS), three-dimensional or non-planar transistor technology, such as fin field effect transistor (FinFET) technology has been developed to replace planar MOS transistors. Since the three-dimensional structure of a FinFET increases the overlapping area between the gate and the fin structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the finFET can be controlled by adjusting the work function of the gate.

Nevertheless, conventional FinFET fabrication techniques of forming recesses after removing part of fin structures to accommodate the growth of epitaxial layer typically causes the fin structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

The present invention provides a semiconductor structure, comprises a substrate, having a recess disposed therein, an insulating layer filled in the recess and disposed on a surface of the substrate, and at least one fin structure disposed in the insulating layer, the fin structure consisting of two terminal parts and a central part disposed between two terminal parts, wherein the terminal parts disposed on the surface of the substrate and directly contact the substrate, and the central part is disposed right above the recess.

The present invention further provides a method for forming a semiconductor structure, comprising the following steps: firstly, a substrate is provided, a fin structure is formed on the substrate, the fin structure consisting of two terminal parts and a central part disposed between two terminal parts, afterwards, a recess is formed in the substrate, wherein the terminal parts are disposed on a surface of the substrate and directly contact the substrate, and the central part is disposed right above the recess, and an insulating layer is formed in the recess and on the surface of the substrate, wherein the fin structure is disposed in the insulating layer.

The feature of the present invention is to provide a novel semiconductor structure and the manufacturing methods thereof. At least a portion of the fin structure is suspended. After the insulating layer is filled in the recess disposed right under the fin structure, the insulating layer is not only disposed on two sides of each fin structure, but also disposed right under the central part of each fin structure. In this way, since the central part of each fin structure does not contact the substrate directly, the isolation ability of the insulating layer (STI) can be improved, thereby avoiding the leakage current occurring, and improving the yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
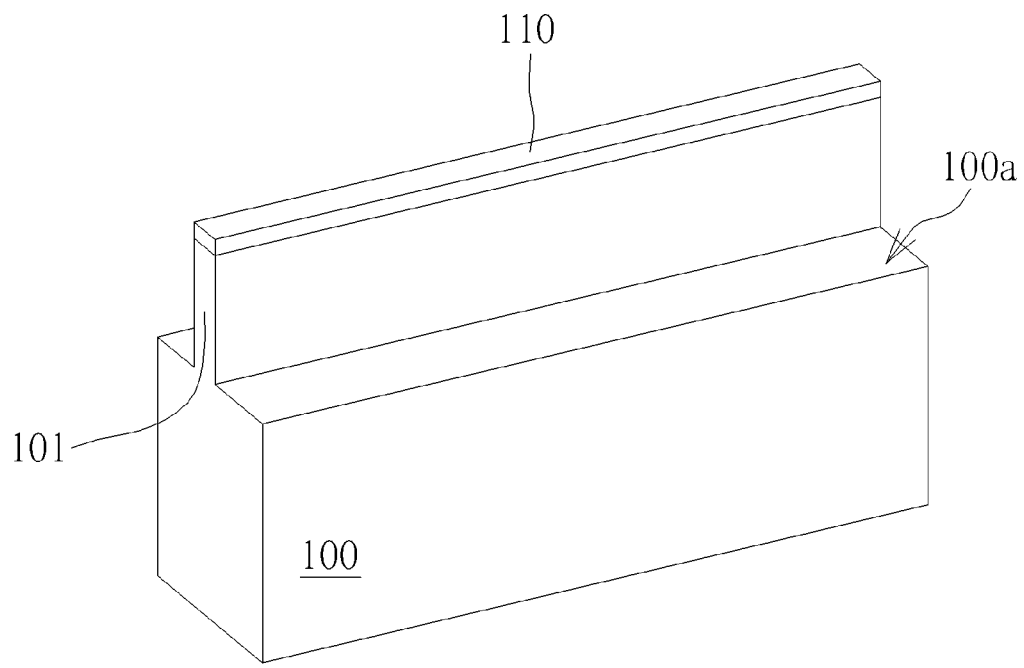
FIG. 1 to FIG. 5 are schematic diagrams showing a method for fabricating a semiconductor structure according to a first preferred embodiment of the present invention.

Please refer to FIG. 1 to FIG. 8, which are schematic diagrams illustrating a method of forming a semiconductor structure according to the first embodiment of the present invention. First of all, as shown in FIG. 1, a substrate 100 is provided, the substrate 100 for example includes a semiconductor substrate, such as a silicon substrate or a silicon germanium substrate, and at least one fin structure 101 is formed in the substrate 100. In an example of bulk silicon, the fin structures 101 may be formed preferably through a sidewall image transfer (SIT) process. The process may include forming a plurality of patterned sacrificial layers (not shown in the drawings) on the substrate 100 by using a photolithography and an etching process, performing a depositing and an etching processes sequentially to form a spacer (not shown in the drawings) at sidewalls of each of the patterned sacrificial layers, and then removing the patterned sacrificial layers and performing another etching process by using the spacer as a mask, thereby transferring the patterns of the spacer to a monolayered or a multilayered patterned mask 110, for example a composite mask structure consisting of a silicon oxide layer, a silicon nitride layer and a silicon oxide layer. After that, another etching process is performed to transfer the patterns of the patterned mask 110 to the substrate 100 underneath, and to form a plurality of trenches 102 and to define each fin structure 101 simultaneously. A top surface of the fin structure 101 is higher than a top surface 100a of the substrate 100 accordingly. Also, in another embodiment, a fin cut process may be further performed to form the fin structures 101 according to the practical requirement, for example, the fin structures 101 parallel to each other. In order to simplify the figures, the following paragraphs only describe one fin structure in each figure, but it can be understood that the present invention preferably comprises a plurality of fin structures 101 parallel to each other.

Alternatively, in another embodiment, the formation of the fin structures 101 may also be accomplished by first forming a patterned hard mask (not shown in the drawings) on the substrate 100, and then performing an epitaxial process on the exposed substrate 100 through the patterned hard mask to form a semiconductor layer (not shown in the drawings), such as a silicon or silicon germanium layer. The semiconductor layer may then be used as the corresponding fin structure.

Figure 2:
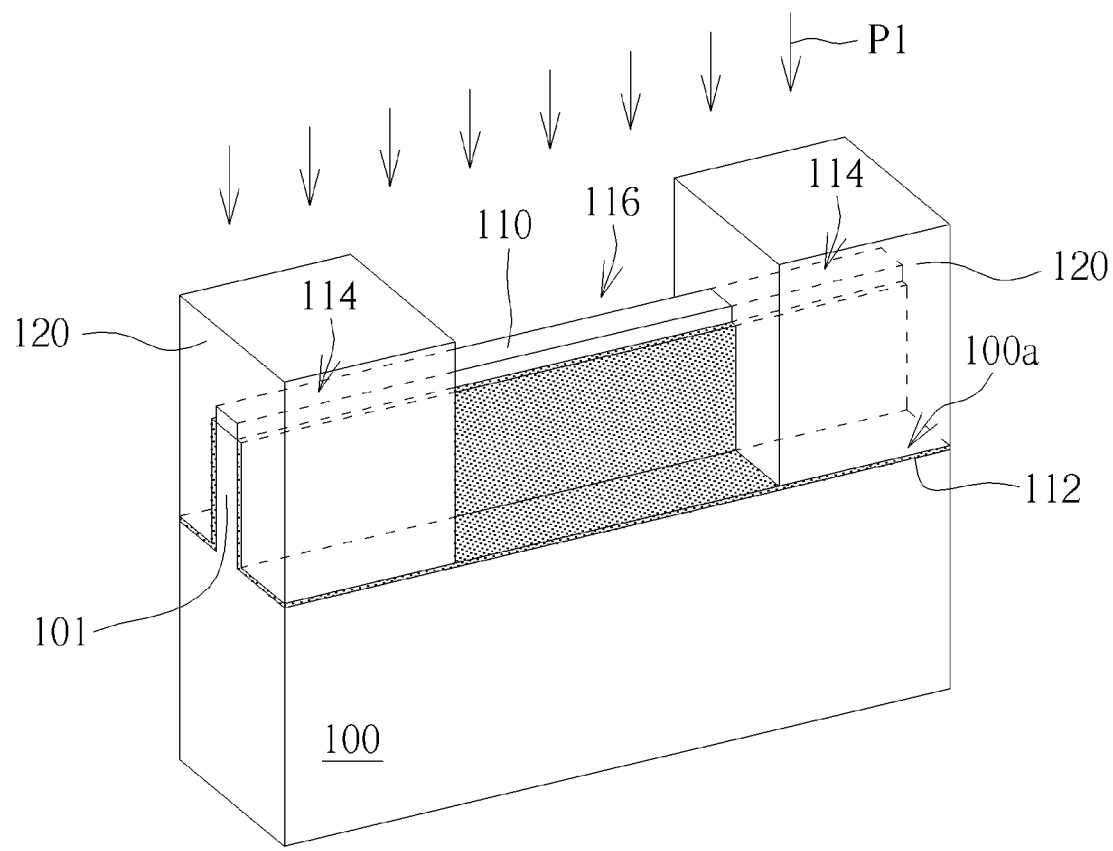

Next, as shown in FIG. 2, an oxidation process P1 is performed to the fin structure 101, so as to form an oxide layer 112 at least on the substrate 100 and on the sidewalls of the fin structure 101 that are not covered by the patterned hard mask 110. A patterned photoresist layer 120 is then formed, covering parts of the fin structure 101. Preferably, the patterned photoresist layer 120 of the present invention covers two terminals of the fin structure 101, but the central part of the fin structure 101 is not covered by the patterned photoresist layer 120. In this step, each part of the fin structure 101 that is covered by the patterned photoresist layer 120 is defined as a terminal part 114, and the part of the fin structure 101 that is not covered by the patterned photoresist layer 120 is defined as a central part 116.

Figure 3:
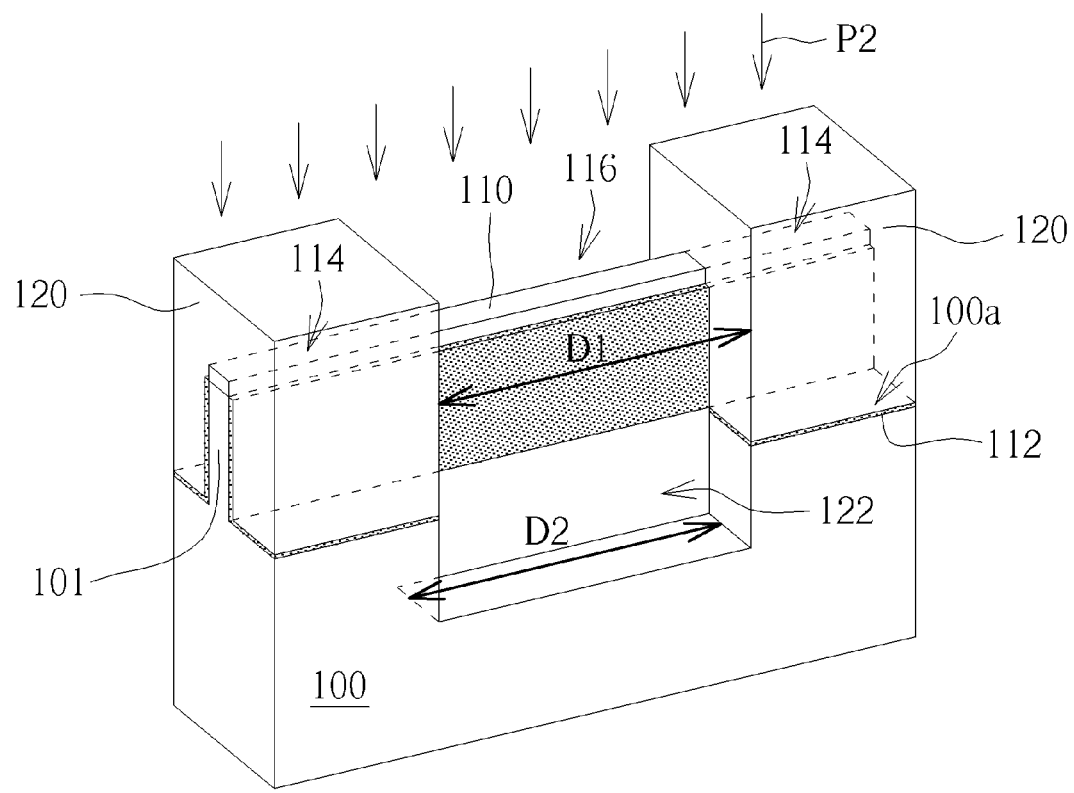

As shown in FIG. 3, an etching process P2 is performed, so as to form two recesses 122 in the substrate 100 and on two sides of the central part 116 of the fin structure 101 respectively. Preferably, the etching process P2 includes an anisotropic etching process (such as a vertical direction etching process) using gases such as fluorine, chlorine, and/or hydrogen bromide, to etch the substrate 100 and the oxide layer 112 on the substrate 100. During the etching process P2, the patterned photoresist layer 120 is used as an etching hard mask. Therefore, the distance D1 between two patterned photoresist layers 120 should equal to the width D2 of the recess 122.

Figure 4:
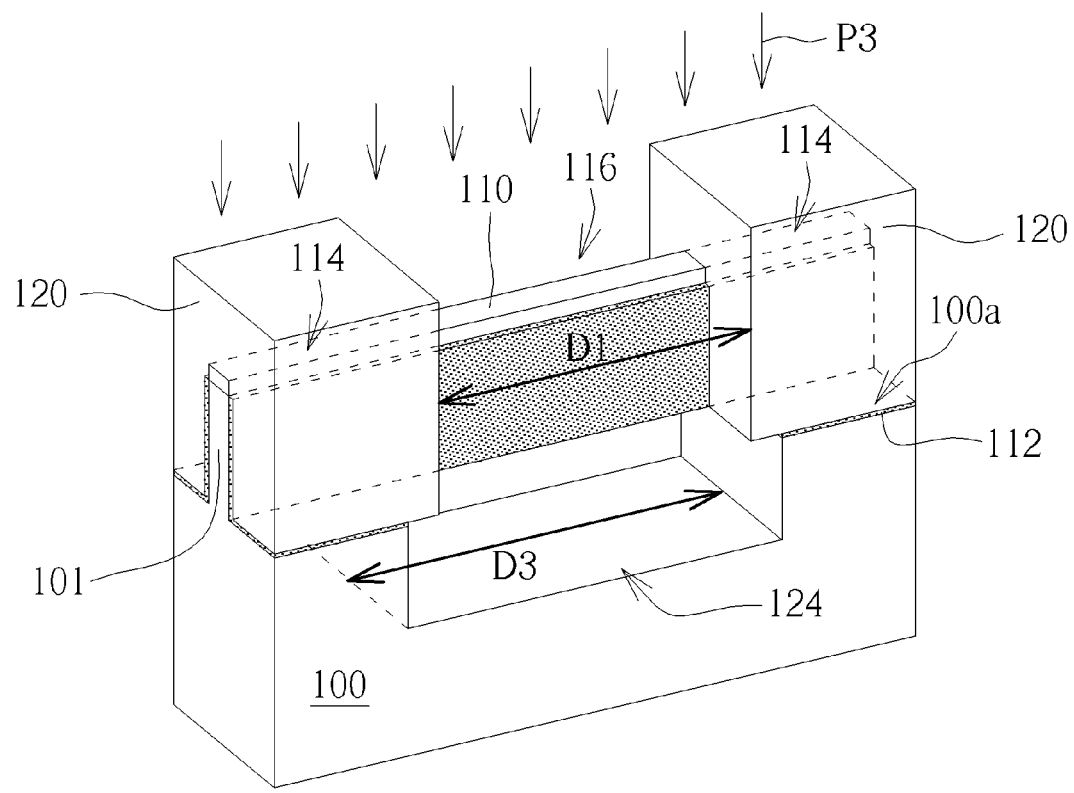

As shown in FIG. 4, another etching process P3 is performed. The etching process P3 preferably comprises an isotropic etching process, using gases such as fluorine and/or chlorine. The etching process P3 at least further etches the sidewalls of the recess 122, to remove a partial substrate 100 that is disposed right under the fin structure 101 and between two recesses 122, so as to connect two recesses 122 to each other, and a recess 124 is therefore formed. It is noteworthy that the central part 116 of the fin structure 101 is disposed right above the recess 124. More precisely, in this step, the terminal parts 114 of the fin structure 101 contact the substrate 100 directly and are disposed on a surface 100a of the substrate 100, which are supported by the substrate 100, but the central part 116 does not contact the substrate 100 directly. Since it is not supported by the substrate 100, the central part 116 is "suspended above" the recess 124. In addition, since the etching process P3 is preferably an isotropic etching process, after the etching process P3 is performed, the sidewalls of the recess 124 may be etched and pull back outwardly, so the width D3 of the recess 124 is preferably larger than the distance D1 between two patterned photoresist layers 120.

Figure 5:
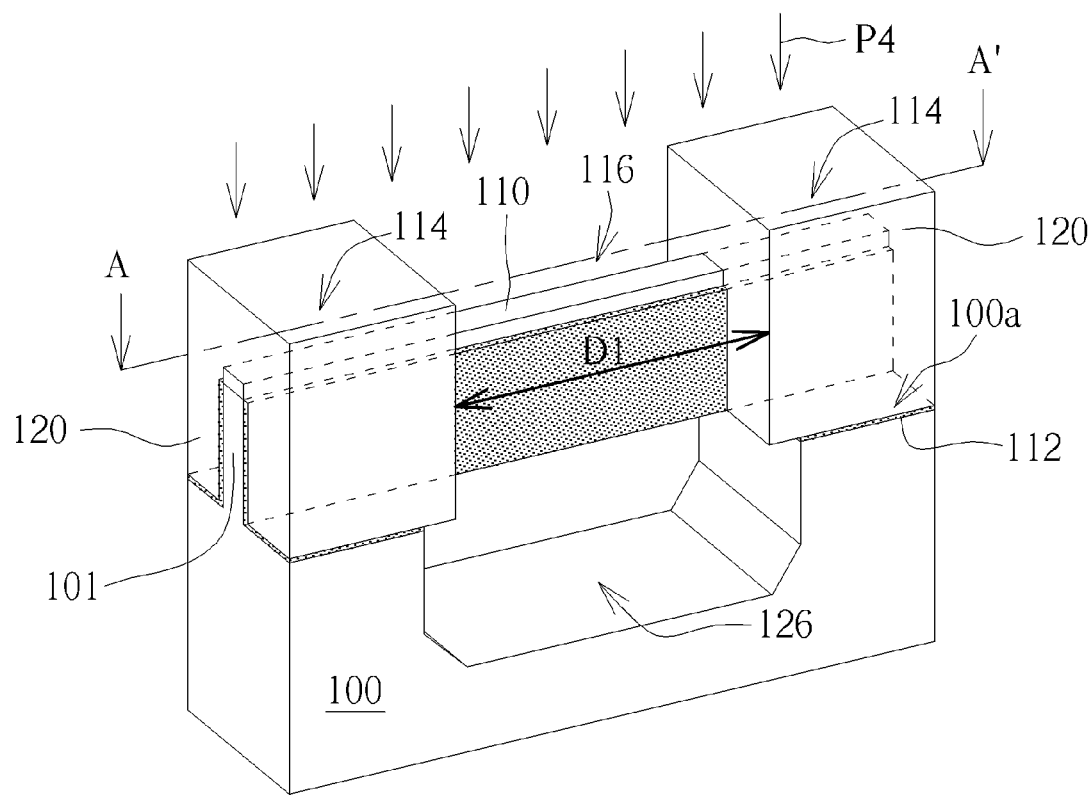
Figure 5A:
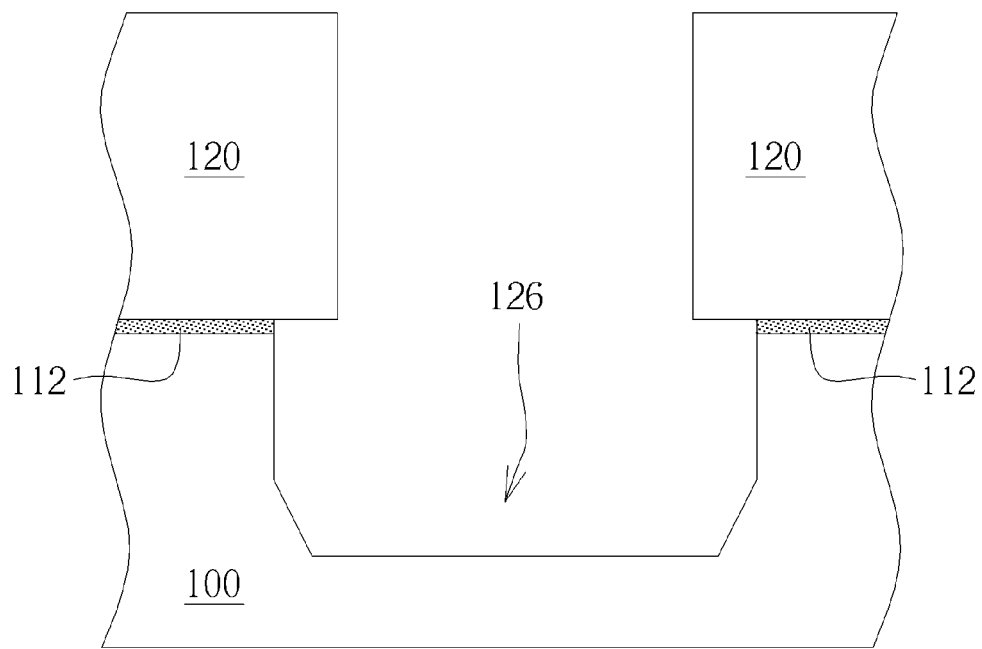
FIG. 5A is a cross section schematic diagram showing the semiconductor structure along a cross section line A-A' in FIG. 5.

Next, as shown in FIG. 5, an etching process P4 can be selectively performed, preferably, the etching process P4 is similar to the etching process P2 mentioned above, such as an anisotropic etching process (a vertical direction etching process) using gases such as fluorine, chlorine, and/or hydrogen bromide, to etch the bottom surface of the recess 124 again, and make the depth of the recess 124 deeper. After the etching process P4 is performed, the recess 126 is formed, and the recess 126 has a polygonal profile. In this embodiment, the recess 126 has a hexagonal profile (please also refer to FIG. 5A, which shows the cross section of the semiconductor structure of FIG. 5 along the cross section line A-A'), but not limited thereto. It is noteworthy that the purpose for performing the etching process P4 is to increase the depth of the recess 124, thereby improving the isolation ability of the shallow trench isolation (STI) formed in the following steps. But the present invention is not limited thereto. More precisely, even if the etching process P4 is skipped, and only if the condition of portion of the substrate 100 that is disposed right under the central part 116 of the fin structure 101 is etched entirely (in other words, the central part 116 of the fin structure 101 does not contact the substrate 100 directly), it should be within the scope of the present invention.

Figure 6:
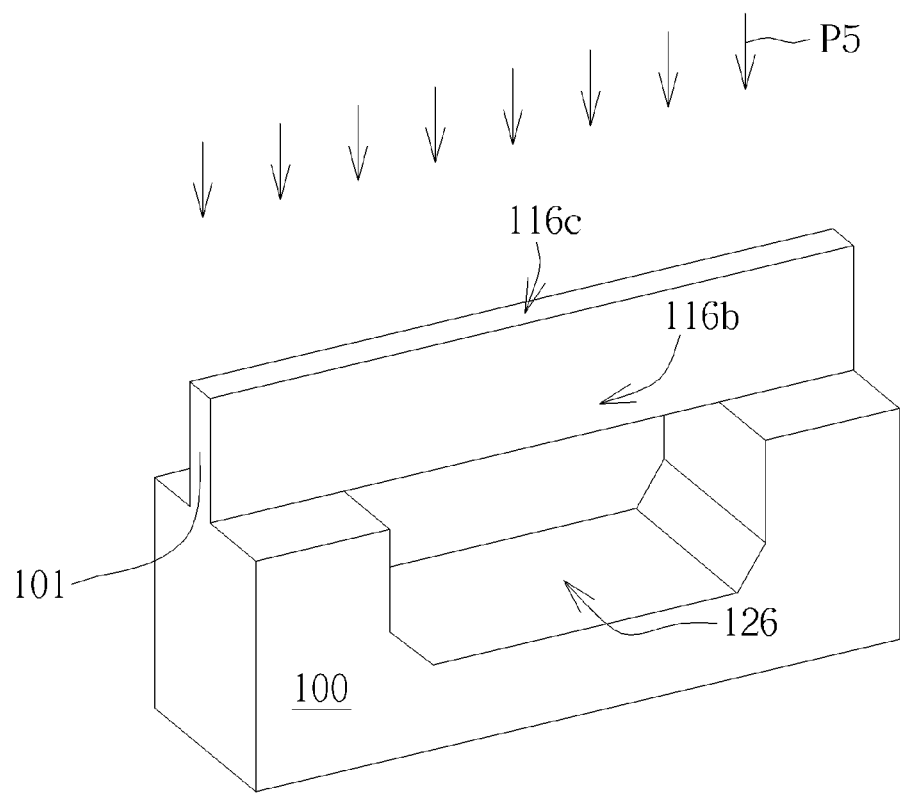
FIG. 6 to FIG. 8 are schematic diagrams showing a method for fabricating a semiconductor structure according to a first preferred embodiment of the present invention.

As shown in FIG. 6, after the patterned photoresist layer 120 is removed, an etching process P5 can be selectively performed, to remove the patterned hard mask 110 disposed on the top surface of the fin structure 101 and to remove the oxide layer 112 disposed on sidewalls of the fin structure 101, at least exposing a top surface 116c and a sidewall 116b of the central part 116 of the fin structure 101. The etching process P5 such as a dry-etching process, preferably is an isotropic etching process using gases such as fluorine or chlorine mixed with helium (He), so as to etch the patterned hard mask 110 and the oxide layer 112, but not limited thereto. The etching process P5 may also comprise a wet-etching process or other methods, and it should also be within the scope of the present invention.

Figure 7:
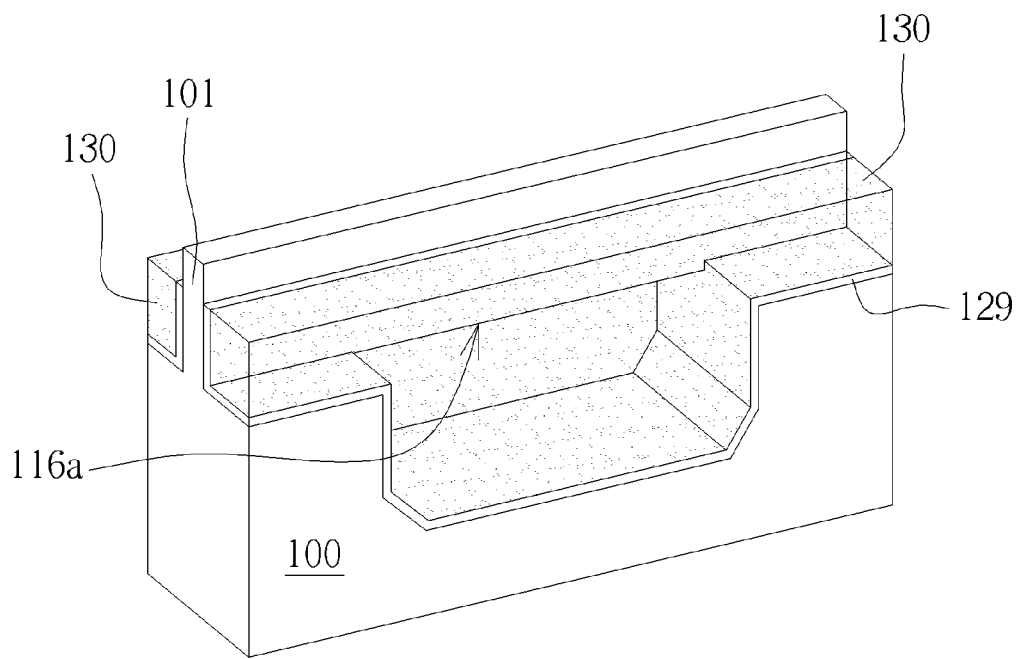

As shown in FIG. 7, an insulating layer (not shown) is entirely formed in the recess 126 and on the surface 100a of the substrate 100, an etching back process is performed to remove parts of the insulating layer, so as to form an insulating layer 130 and to expose a portion of the fin structure 101, and the rest portion of the fin structure 101 is embedded in the insulating layer 130. More precisely, the insulating layer 130 of the present embodiment contacts a bottom surface 116a and two sidewalls 116b of the central part 116, but does not contact the top surface 116c of the central part 116. Therefore, a top surface 130a of the insulating layer 130 is lower than the top surface of the fin structure 101 (the top surface 116c), but higher than the surface 100a of the substrate 100. Besides, before the insulating layer 130 is formed, a liner 129 such as a silicon oxide layer can be selectively formed, covering the bottom surface and the sidewalls of the recess 126, and also contacts the surface 100a of the substrate 100 and partial sidewalls of the fin structure 101 (including partial sidewall of the terminal parts 114 and partial sidewall of the central part 116).

Figure 8:
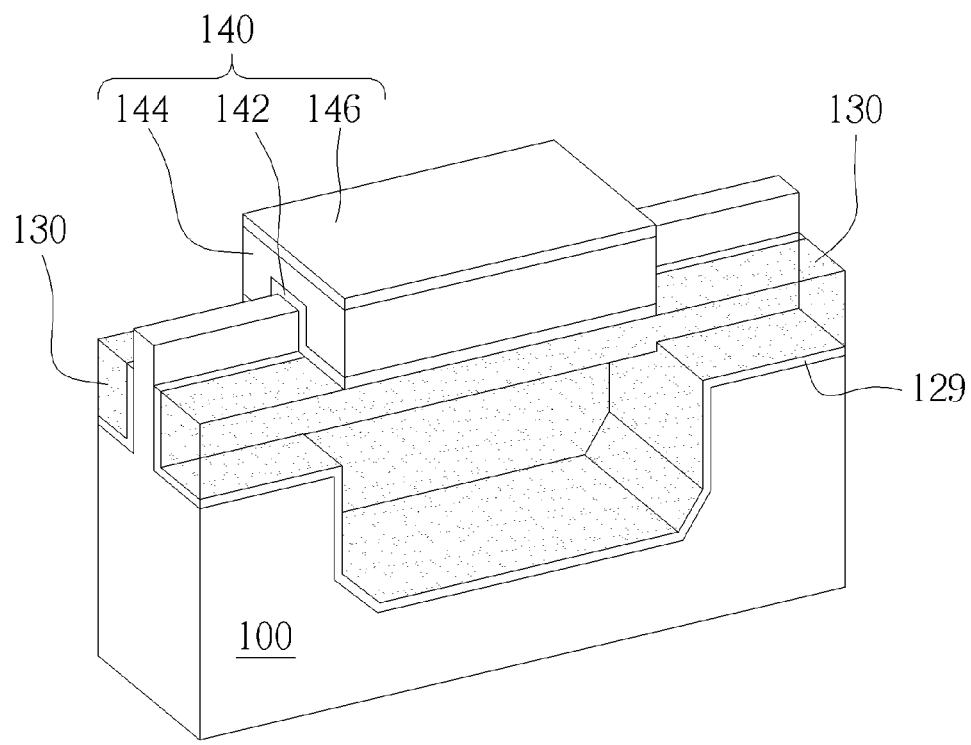

As shown in FIG. 8, a plurality of gate structures 140 are formed on the insulating layer 130 and cross over each fin structure 101. Each gate structure 140 includes a gate dielectric layer 142, a gate conductive layer 144 and a cap layer 146. The material of the gate dielectric layer 142 may include silicon oxide (SiO), silicon nitride (SiN), silicon oxynitride (SiON), or a high-k dielectric material having a dielectric constant (k value) larger than 4 such as metallic oxide, such as hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta2O$_9$, SBT), lead zirconate titanate (PbZrxTi$_1$-xO$_3$, PZT), barium strontium titanate (BaxSr$_1$-xTiO$_3$, BST) or a combination thereof. The material of the gate conductive layer 144 may include undoped polysilicon, heavily doped polysilicon, or one or a plurality of metal layers such as a work function metal layer, a barrier layer and a low-resistance metal layer, etc. The cap layer 146 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. Besides, spacers should also be disposed on two sides of the gate structure 140, but in order to simplify the figure, spacers are not shown in FIG. 8.

It is noteworthy that the gate structure 140 covers the insulating layer 130 and on the exposed fin structure 101. In other words, the gate structure 140 covers the exposed surface of the central part 116 of the fin structure 101 (including the top surface 116c and partial sidewall 116b), but does not contact the bottom surface 116a of the central part 116. After the gate structure 140 is formed, the semiconductor structure can be combined with other related processes, such as forming the interlayer dielectric (ILD), performing the salicide process, forming the epitaxial layer and forming the contact plugs. The processes mentioned above are well-known to those skilled in the art, and will not be described again.

The following description will detail the different embodiments of the semiconductor structure and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
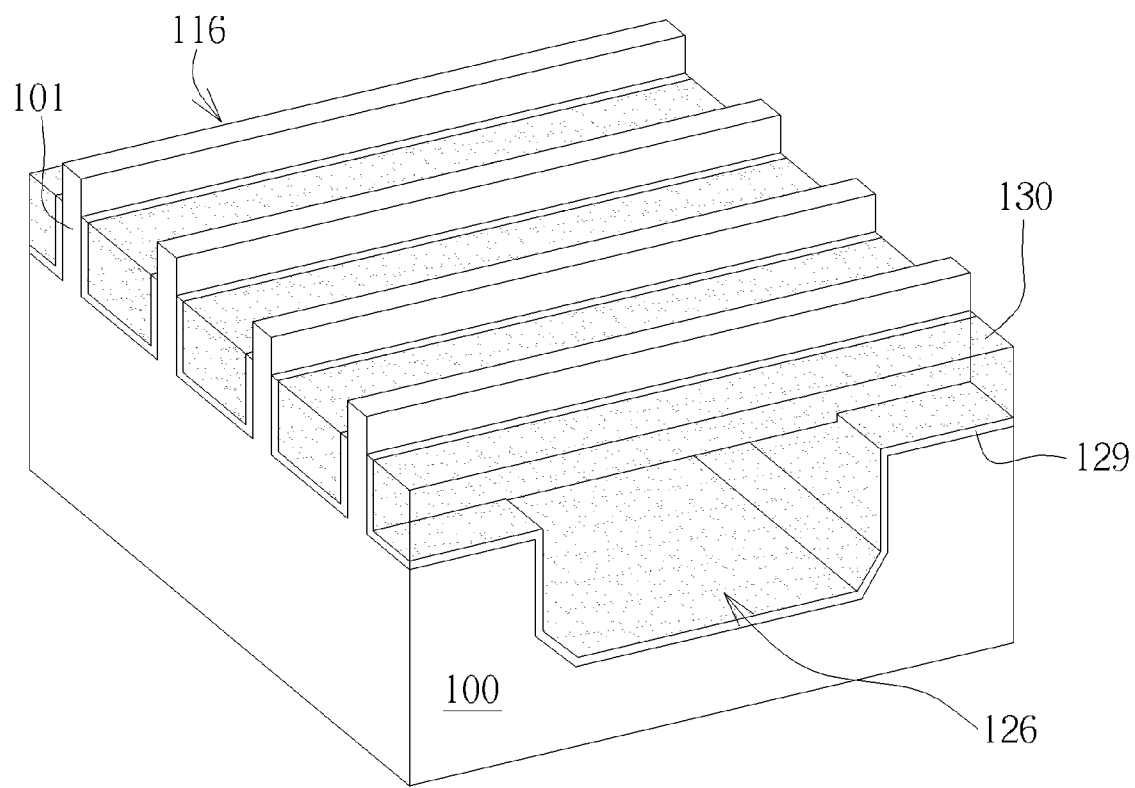
FIG. 9 is a schematic diagram showing a semiconductor structure having a plurality of fin structures according to another preferred embodiment of the present invention.

FIG. 9 shows another embodiment of the semiconductor structure of the present invention. This embodiment includes a plurality of fin structures 101 parallel to each other, and a recess 126 is disposed under the central part 116 of each fin structure 101. The extending direction of the recess 126 is perpendicular to the arrangement direction of each fin structure 101, and the recess 126 penetrates through the space under the central part 116 of the fin structure 101. In other words, the central part 116 of each fin structure 101 is suspended above the recess 126, and the terminal parts (not shown) of each fin structure 101 are supported by the substrate 100 on two sides of the recess 126 (similar to the structure shown in FIG. 6). The feature of the present invention is to provide a novel semiconductor structure and the manufacturing methods thereof. At least a portion of the fin structure is suspended, and after the insulating layer 130 is filled in the recess 126 disposed right under the fin structure 101, the insulating layer 130 is not only disposed on two sides of each fin structure 101, but also disposed right under the central part 116 of each fin structure 101. In this way, since the central part 116 of each fin structure 101 does not contact the substrate directly, the isolation ability of the insulating layer (STI) can be improved, thereby avoiding the leakage current occurring, and improving the yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
   a substrate, having a recess disposed therein;
   an insulating layer filled in the recess and disposed on a surface of the substrate; and
   at least one fin structure disposed in the insulating layer, the fin structure consisting of two terminal parts and a central part disposed between two terminal parts, wherein the terminal parts are disposed on the surface of the substrate and directly contact the substrate, and the central part is disposed right above the recess, besides, the terminal parts, the central part and the fin structure include the same material, and the terminal parts, the central part and the fin structure are arranged along a same direction.
2. The semiconductor structure of claim 1, wherein a top surface of the fin structure is higher than the surface of the substrate.
3. The semiconductor structure of claim 1, wherein the central part does not contact the substrate directly.
4. The semiconductor structure of claim 1, wherein a top surface of the fin structure is higher than a top surface of the insulating layer.
5. The semiconductor structure of claim 1, further comprising a gate structure, disposed on the insulating layer and across parts of the fin structure.
6. The semiconductor structure of claim 5, wherein the gate structure covers a top surface and two sidewalls of the central part of the fin structure.
7. The semiconductor structure of claim 5, wherein the gate structure does not contact a bottom surface of the central part of the fin structure directly.
8. The semiconductor structure of claim 5, further comprising a gate dielectric layer disposed between the gate structure and the fin structure.
9. The semiconductor structure of claim 1, wherein the recess has a polygonal profile.
10. A method for forming a semiconductor structure, comprising:
    providing a substrate;
    forming a fin structure on the substrate, the fin structure consisting of two terminal parts and a central part disposed between two terminal parts;
    forming a recess in the substrate, wherein the terminal parts are disposed on a surface of the substrate and directly contact the substrate, and the central part is disposed right above the recess, besides, the terminal parts and the central part include the same material, and the terminal parts and the central part are arranged along a same direction; and
    forming an insulating layer in the recess and on the surface of the substrate, wherein the fin structure is disposed in the insulating layer.
11. The method of claim 10, wherein a top surface of the fin structure is higher than the surface of the substrate.
12. The method of claim 10, wherein the central part does not contact the substrate directly.
13. The method of claim 10, wherein a top surface of the fin structure is higher than a top surface of the insulating layer.

14. The method of claim 10, further comprising forming a gate structure on the insulating layer and across parts of the fin structure.

15. The method of claim 14, wherein the gate structure covers a top surface and two sidewalls of the central part of the fin structure.

16. The method of claim 14, wherein the gate structure does not contact a bottom surface of the central part of the fin structure directly.

17. The method of claim 10, wherein the method for forming the recess comprising performing a first anisotropic etching process, performing a second isotropic etching process and performing a third anisotropic etching process is sequence.

18. The method of claim 17, wherein the recess has a polygonal profile.

19. The method of claim 10, wherein before the recess is formed, further comprising forming two photoresist layers cover the terminal parts of the fin structure, and using the photoresist layers as hard masks to perform an etching process, so as to form the recess in the substrate.

20. The method of claim 19, wherein a width of the recess is larger than the distance between two photoresist layers.

* * * * *